US011119543B2

(12) United States Patent
Thakar et al.

(10) Patent No.: US 11,119,543 B2
(45) Date of Patent: *Sep. 14, 2021

(54) CLOSED LOOP HYBRID COOLING

(71) Applicant: Cisco Technology, Inc., San Jose, CA (US)

(72) Inventors: Anant Thakar, Los Altos, CA (US); Rakesh Bhatia, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/871,620

(22) Filed: May 11, 2020

(65) Prior Publication Data

US 2020/0341524 A1   Oct. 29, 2020

Related U.S. Application Data

(63) Continuation of application No. 16/358,525, filed on Mar. 19, 2019, now Pat. No. 10,684,661.

(51) Int. Cl.
*H05K 7/20* (2006.01)
*G06F 1/20* (2006.01)

(52) U.S. Cl.
CPC .......... *G06F 1/20* (2013.01); *H05K 7/20772* (2013.01); *G06F 2200/201* (2013.01)

(58) Field of Classification Search
CPC ................................................. H05K 7/20772
See application file for complete search history.

(56) References Cited

U.S. PATENT DOCUMENTS

| | | |
|---|---|---|
| 5,285,347 A | 2/1994 | Fox et al. |
| 7,068,509 B2 | 6/2006 | Bash et al. |
| 8,422,218 B2 | 4/2013 | Fried et al. |
| 9,027,360 B2 | 5/2015 | Chainer et al. |
| 9,086,859 B2 | 7/2015 | Kttlesey |
| 9,351,424 B2 | 5/2016 | Facusse et al. |
| 2007/0125522 A1* | 6/2007 | Stefanoski ............. F28D 15/04 165/104.21 |
| 2016/0128238 A1 | 5/2016 | Shedd et al. |

FOREIGN PATENT DOCUMENTS

EP   2706568 A2   3/2014

OTHER PUBLICATIONS

International Search Report and Written Opinion from the International Searching Authority, dated Jun. 22, 2020, 12 pages, for corresponding International Patent Application No. PCT/US2020/022959.

* cited by examiner

*Primary Examiner* — Hung V Ngo
(74) *Attorney, Agent, or Firm* — Polsinelli

(57) ABSTRACT

A hybrid cooling server assembly can have a printed circuit board (PCB) with a processor socket disposed thereon and a hybrid cooling plate can be operably coupled with the processor socket. A radiator can having a working fluid received therein and be in fluidic communication with the radiator and the hybrid cooling plate by one or more tubular members. One or more cooling fans can be proximal to the radiator. The working fluid can be operable to receive heat from the cooling plate and reject heat at the radiator and the one or more cooling fans can be operable to produce an airflow across the hybrid cooling plate, thereby allowing the hybrid cooling plate transfer thermal energy to the airflow.

20 Claims, 6 Drawing Sheets

CLOSED LOOP HYBRID COOLING

CROSS REFERENCE TO RELATED APPLICATIONS

This application is a Continuation of U.S. patent application Ser. No. 16/358,525, filed on Mar. 19, 2019, entitled "CLOSED LOOP HYBRID COOLING," which is expressly incorporated by reference herein in its entirety.

TECHNICAL FIELD

The present disclosure relates generally to cooling systems.

BACKGROUND

Electronic devices generate significant amounts of thermal energy during use, and thus require thermal cooling solutions to reduce the temperature of the electronic device by rejecting heat energy to maintain electronic devices within desirable operating temperatures. Recent performance gains in electronic devices, and corresponding increases in thermal energy generation, have increased the need for cooling solutions.

DESCRIPTION OF EXAMPLE EMBODIMENTS

Figure 1:
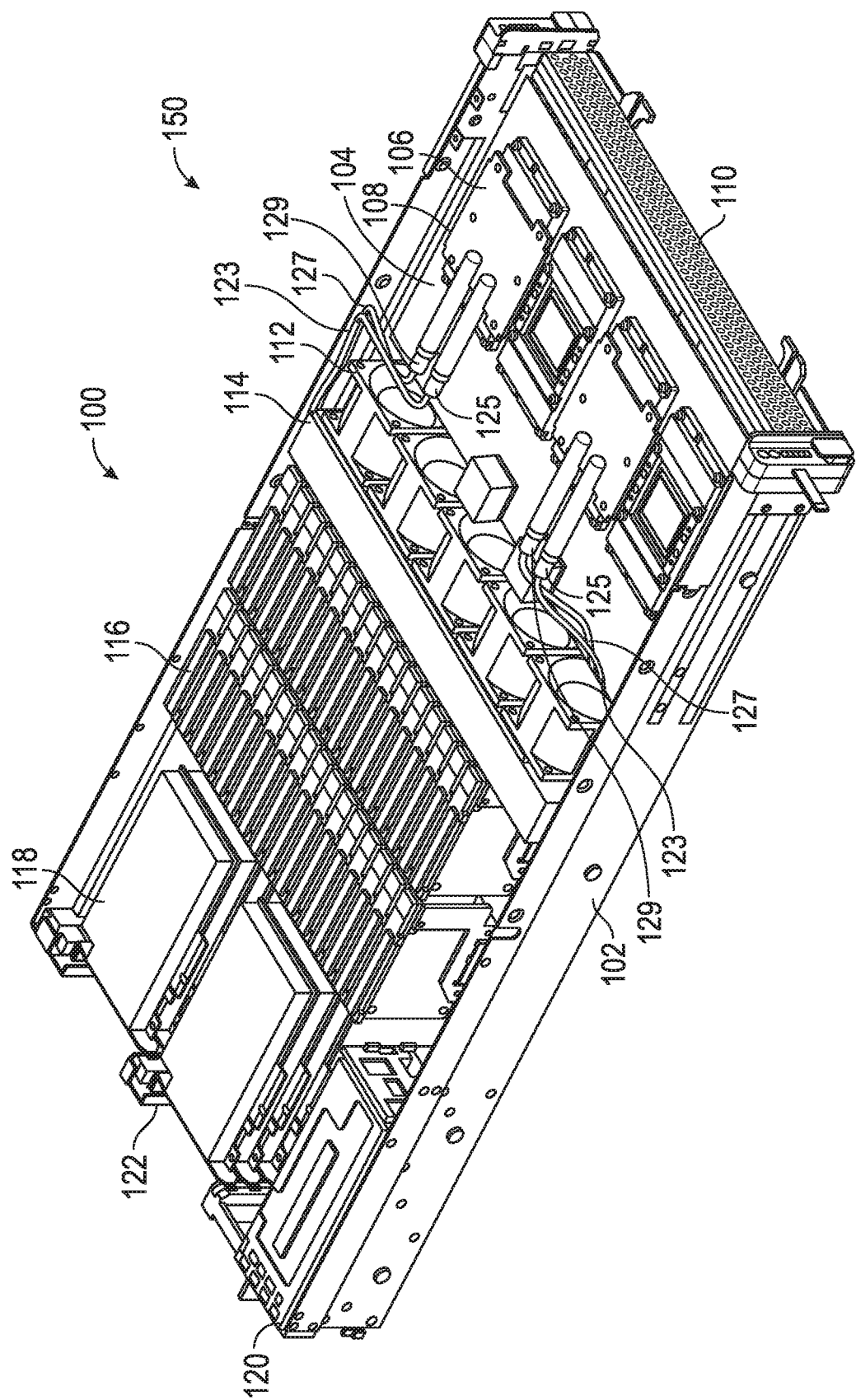
FIG. 1 illustrates an isometric view of a server assembly having a hybrid cooling system therein, according to at least on example of the present disclosure.

Overview:

A server assembly can have a housing operable to receive a printed circuit board (PCB) having one or more a central processor units (CPU) and/or one or more graphics processing units (GPU) disposed thereon. A hybrid cooling plate can be operably coupled with the one or more CPUs and/or one or more GPUs. A radiator can be received within the housing and have a working fluid received therein. The working fluid can be in fluidic communication with the radiator and the hybrid cooling plate by one or more tubular members. The radiator can have one or more fans proximally arranged within the housing.

Example Embodiments:

The present disclosure is described with reference to the attached figures, wherein like reference numerals are used throughout the figures to designate similar or equivalent elements. The figures are not drawn to scale and they are provided merely to illustrate the instant technologies. Several aspects of the disclosure are described below with reference to example applications for illustration. It should be understood that numerous specific details, relationships, and methods are set forth to provide a full understanding of the disclosure. One having ordinary skill in the relevant art, however, will readily recognize that aspects of the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Several definitions that apply throughout this disclosure will now be presented. The terms "comprising," "including" and "having" are used interchangeably in this disclosure. The terms "comprising," "including" and "having" mean to include, but are not necessarily limited to, the things so described.

The term "coupled with" is defined as connected, either directly or indirectly through intervening components, and the connections are not necessarily limited to physical connections, but are connections that accommodate the transfer of data between the so-described components. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder.

FIG. 1 details a server assembly implementing a hybrid cooling system. The server assembly 100 can have a housing 102 operable to receive a printed circuit board (PCB) 104 therein. The PCB 104 can have one or more processor sockets 106 operable to receive one or more processors such as one or more central processing units (CPUs) (shown more clearly in FIG. 2), one or more graphics processing units (GPUs) 108, etc., which can be disposed thereon.

Each of the one or more processor sockets 106 can have a hybrid cooling plate 108 coupled thereto. The hybrid cooling plate 108 can be operable to draw heat generated CPU and/or GPU received in the processor socket 106 away therefrom.

The PCB 104 can be proximal to a front surface 110 of the housing 102. The front surface 110 can be an air inlet for the server housing 102, thereby providing the processor sockets 106 and the one or more CPUs and/or GPUs therein with ambient air prior to any heat absorption within the server assembly 100. The CPUs and/or GPUs can be the highest wattage and highest temperature generating components within the server assembly 100, thus requiring the largest cooling needs. Arranging the CPUs and/or the GPUs proximal the front surface 110 can increase the thermal efficiency and cooling capacity of a hybrid cooling system 150.

The server assembly 100 can have a plurality of fans 112 arranged adjacent to the PCB 104. While FIG. 1 illustrates five fans 112, it is within the scope of this disclosure to implement any number of fans 112 depending on the arrangement and/or size of the server housing 102. In at least one instance, each fan 112 is a 76 millimeter (mm)=56 mm counter-rotating direct current (DC) axial fan. Each fan 112 can be size and shaped to maximize air flow and cooling capacity within the server assembly 100 depending on the server housing 102 form factor.

A radiator 114 can be arranged adjacent to the plurality of fans 112. The plurality of fans 112 can be arranged to generate an airflow across the radiator 114, thereby allowing the radiator to reject heat to the airflow within the server assembly 100. The radiator 114 can have a working fluid received therein for absorbing heat and rejecting heat through the radiator 114 and into the airflow. The working fluid can be fluid having desirable heat transfer properties including, but not limited to, water, and/or Freon. In at least one instance, the working fluid can be water having glycol mixed therein to prevent freezing of the working fluid and/or a corrosion inhibitor to prevent corrosion of the radiator 114 and/or server assembly 100 components in contact with the working fluid.

Figure 4:
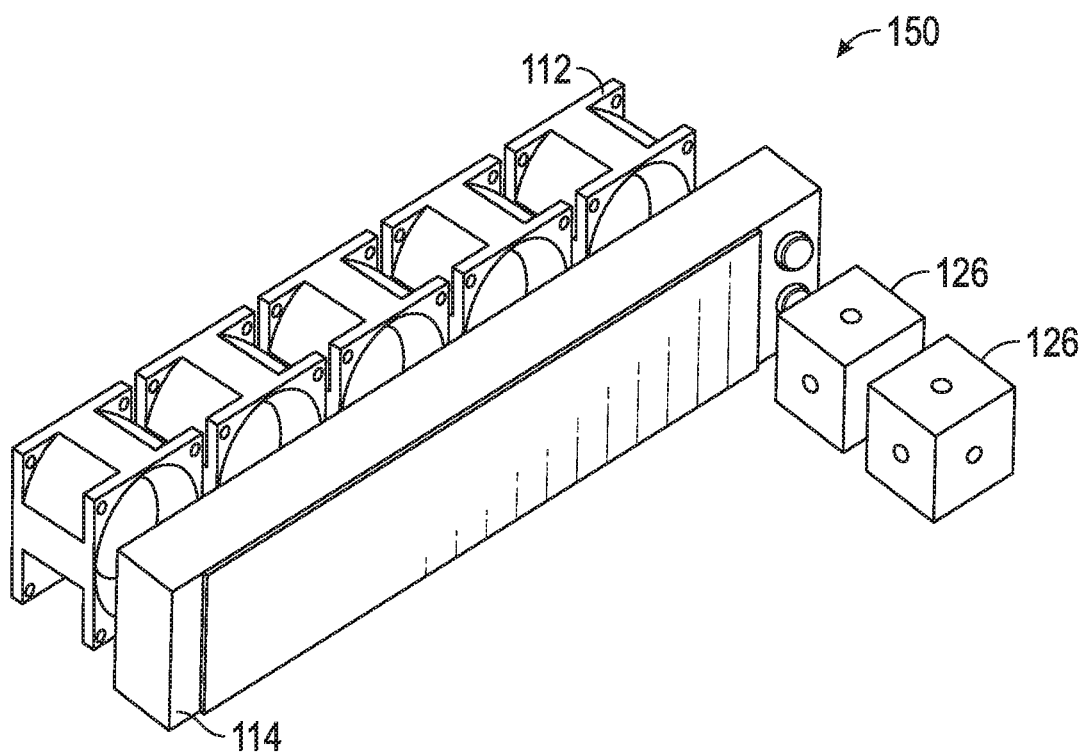
FIG. 4 illustrates an isometric view of a fan array, radiator and pump of a hybrid cooling system, according to at least one example of the present disclosure.

The working fluid can be moved through the hybrid cooling system via one or more pumps 126 (described in more detail with respect to FIG. 4). An inlet feed line 123 can provide the cooling plate 108 with working fluid at a predetermined temperature and an outlet feed line 127 can allow removal of the working fluid from the cooling plate 108 after receiving thermal energy. The inlet feed line 123 can couple with the cooling plate 108 via a quick connect coupling 125 allowing a releasable, secure fluid tight coupling between the inlet feed line 123 and the cooling plate 108. The outlet feed line 127 can similarly include a quick connect coupling 129 with the cooling plate 108. The quick connect couplings 125, 129 can allow the feed lines 123, 127 to be coupled and de-coupled with the cooling plate 108. In at least one instance, the quick connect couplings 125, 129 can be push-fit couplings. In other instances, the quick connect couplings 125, 129 can have locking collet assembly securing the feed line 123, 127 with the cooling plate 108.

The hybrid cooling plate 108, plurality of fans 112, and radiator 114 can collectively form the hybrid cooling system 150. The hybrid cooling system 150 can dynamically engage air flow cooling via the hybrid cooling plate 108 and the plurality of fans and/or liquid cooling via the hybrid cooling plate 108 and the radiator 114.

The server assembly 100 can be arranged to receive a plurality of hard disk drives (HDDs) 116, peripheral component interface express (PCIe) cards 118, and/or power supplies 120 therein. The plurality of HDDs 116 can be arranged adjacent to the radiator 114 while the PCIe cards 118 can be adjacent to the plurality of HDDs. The PCIe cards 118 can provide various input/output (I/O) coupling ports proximal to a rear surface 122, thus allowing the server assembly 100 to be coupled to a local area network (LAN), wide area network (WAN), and/or other electronic devices.

The rear surface 122 can also provide an air outlet for the airflow through the front surface 110 generated by the plurality of fans 112. The power supply 120 can be disposed proximal the rear surface 122 and operable to receive input power. The power supply 120 can distribute power to the internal components of the server assembly including, but not limited to, PCIe cards 118, HDDs 116, plurality of fans 112, GPUs 108, CPUs 106, and/or PCB 104.

Figure 2:
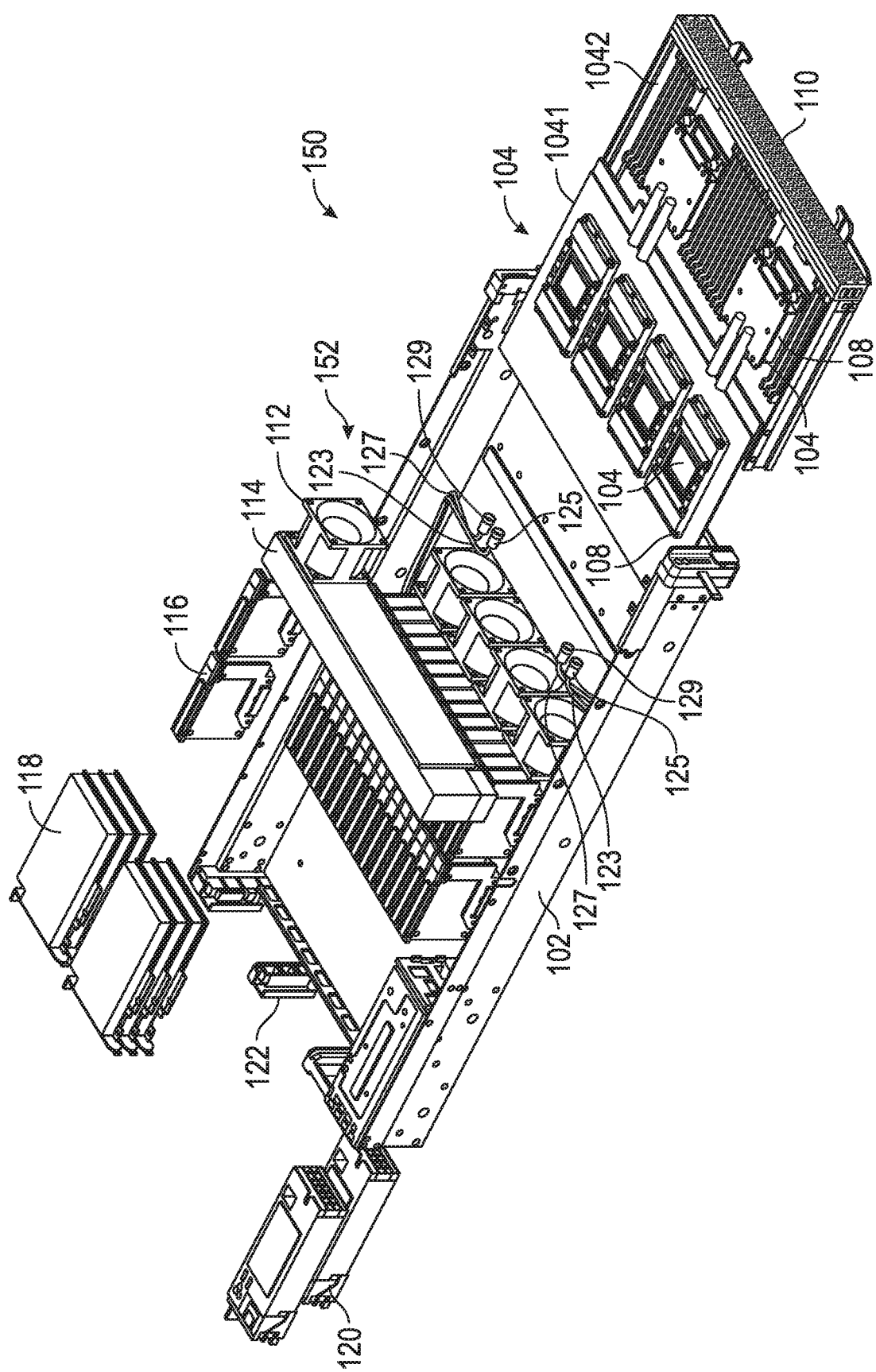
FIG. 2 illustrates an exploded isometric view of a server assembly having a hybrid cooling system therein, according to at least one example of the present disclosure.

FIG. 2 details and exploded view of a server assembly. The server assembly 100 can have a two-tier PCB 104 arrangement having one or more processor sockets 106 on a lower tier 1041 and one or more processor sockets 106 on an upper tier 1042. The two-tier PCB 104 arrangement can allow the server assembly 100 to implement more processor sockets 106 made possible by the increased cooling capacity of the hybrid cooling system 150.

Each processor socket 106 on the two-tier PCB 104 arrangement can have a hybrid cooling plate 108 coupled therewith. The hybrid cooling plate 108 can be fluidly coupled with the radiator 114 by one or more fluid lines. The two-tier PCB 104 arrangement can also provide increased airflow across the one or more processor sockets 106 by allowing more ambient air to be introduced each processor socket and reducing shadow core (e.g., serial arrangement) of processor sockets 106.

As can be appreciated in FIG. 1 and FIG. 2, the plurality of fans 112 can be sized and shaped to substantially cover the available surface of the radiator 114, thus maximizing the efficiency and cooling capacity of the radiator 114. The plurality of fans 112 can be operable to produce an airflow from the front surface 110 across the one or more processor sockets 106, while also producing an airflow across the radiator 114, thus allowing the radiator 114 to reject heat absorbed by the working fluid.

Figure 3:
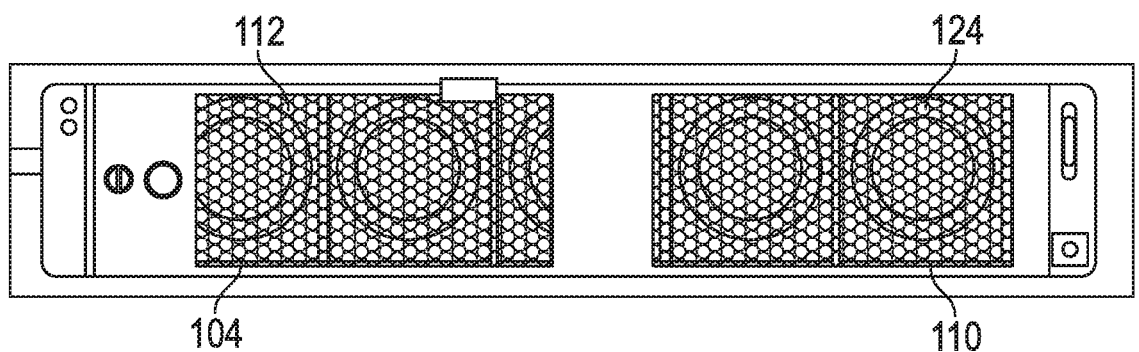
FIG. 3 illustrates a front planar view of a server assembly having a hybrid cooling system, according to at least one example of the present disclosure.

FIG. 3 details a front view of a server assembly having a hybrid cooling system. The server assembly 100 can have a front surface 110 having one or more air inlets 124 formed therein. The one or more air inlets 124 can allow air to be drawn into the server housing 102 through the front surface 110 by a pressure differential generated by the plurality of fans 112.

The one or more air inlets 124 can be sized and shaped to maximize airflow into the server housing 102, while reducing introduction of particulates (e.g. dust) into the server housing 102. The one or more air inlets 124 can have a grille like pattern formed from a plurality of vertical and/or horizontal slits and/or slots, or a reoccurring geometric pattern, such as hexagons.

The PCB 104 can be proximally arranged to the front surface 110 caused the airflow generated by the plurality of fans 112 to initially pass across the PCB 104 and the one or more processor sockets 106 disposed thereon. In at least one instance, the ambient air drawn into the server housing 102 is maintained at a temperature below 20° C.

FIG. 4 details a plurality of fans, a radiator, and a pump of a liquid cooling arrangement within a hybrid cooling system. The hybrid cooling system 150 can include a plurality of fans 112 and a radiator 114. The plurality of fans 112 can be operable to pass an airflow across the radiator 114, thus allowing the radiator to reject heat absorbed by a working fluid therein.

The radiator 114 can have a working fluid received therein and operable to absorb heat from the CPUs and/or GPUs received in the processor sockets 106. The working fluid can flow through the hybrid cooling system 150 via one or more tubular members coupling the radiator 114 with the hybrid cooling plates 108 (shown in FIGS. 1 and 2). A pump 126 can generate a pressure differential within the working fluid allowing the working fluid to move through the one or more tubular members, the radiator 114, and the hybrid cooling plates 108, thus allowing heat absorption, transfer, and rejection within the liquid cooling arrangement 152 of the hybrid cooling system 150.

Figure 5:
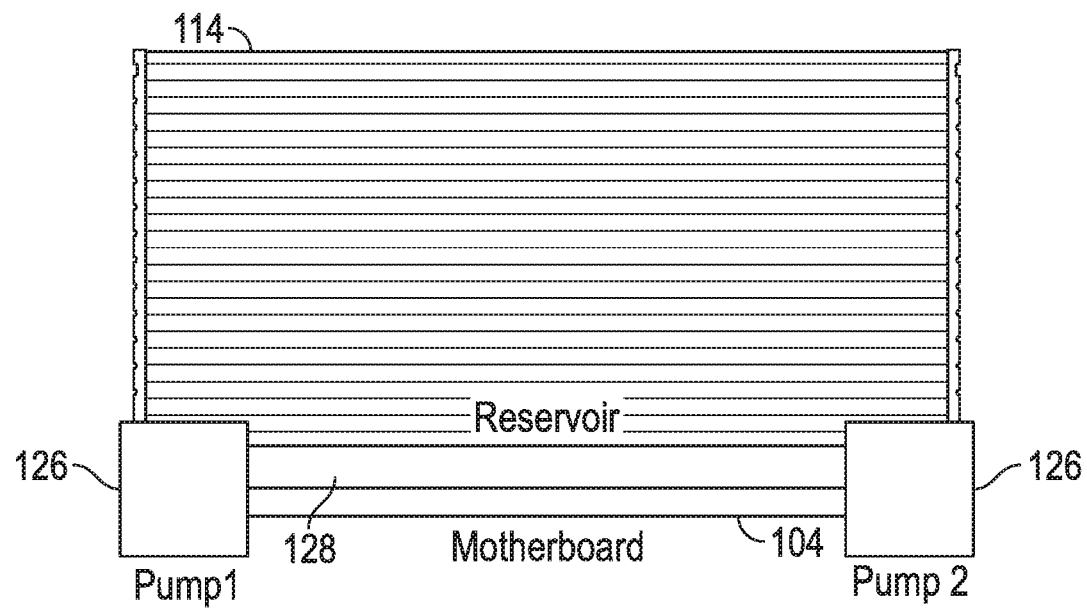
FIG. 5 illustrates a planar cross-section of the server assembly, according to at least one example of the present disclosure.

FIG. 5 details a liquid cooling arrangement of a hybrid cooling system. The radiator 114 can be disposed above at least a portion of the PCB 104. A reservoir 128 can disposed between the PCB 104 and the radiator 114. The reservoir 128 can be operable to contain at least a portion of the working fluid, thought the portion of the working fluid received within the reservoir 128 can be excess and/or for use in increasing the thermal capacity of the liquid cooling system.

The radiator 114 can be any force of heat exchanger used to transfer thermal energy from one medium to another. The radiator 114 can be operable to transfer thermal energy received from the working fluid (and the hybrid cooling plates) to the airflow within the server housing. The radiator 114 can have a plurality of radiator tubes therein allowing the working fluid to transfer the absorbed thermal energy to the radiator 114. The radiator tubes can transfer the heat to a plurality of fins formed along the radiator tubes. The plurality of fins can increase the surface area to the radiator 114 and are operable to release the heat to the ambient airflow within the server housing 102.

The liquid cooling arrangement 152 of the hybrid cooling system 150 can also include one or more pumps 126. The one or more pumps 126 can generate a pressure differential within the liquid cooling arrangement 152, thereby allowing the working fluid to move within the liquid cooling arrangement 152. The one or more pumps 126 can have an inlet and an outlet, with the outlet pressure being greater than the inlet pressure which causes the working fluid to move and/or flow within the liquid cooling arrangement.

In at least one instance, the one or more pumps 126 can be negative head pressure pumps which allows the working fluid within the liquid cooling arrangement 152 to be maintained below atmospheric pressure. A negative head pump can have an outlet pressure greater than an inlet pressure with the outlet pressure and inlet pressure below atmospheric pressure, respectively. The negative head pump 126 within the liquid cooling arrangement 152 can prevent the working fluid from leaking into the server assembly 100 because of the inherent pressure differential between atmospheric and the working fluid. The pressure differential between atmospheric and the inlet pressure and outlet pressure of the negative head pump 126 can allow the working fluid to return to the radiator 114 and/or reservoir in the event of a leak, thereby preventing working fluid from being uncontrollably discharged into the server assembly 100. This arrangement can reduce potential damage to one or more components of the server assembly 100 while also reducing overall complexity by eliminating the need to monitor and/or shutdown the liquid cooling arrangement 152 in the event of a minor leak.

Figure 6:
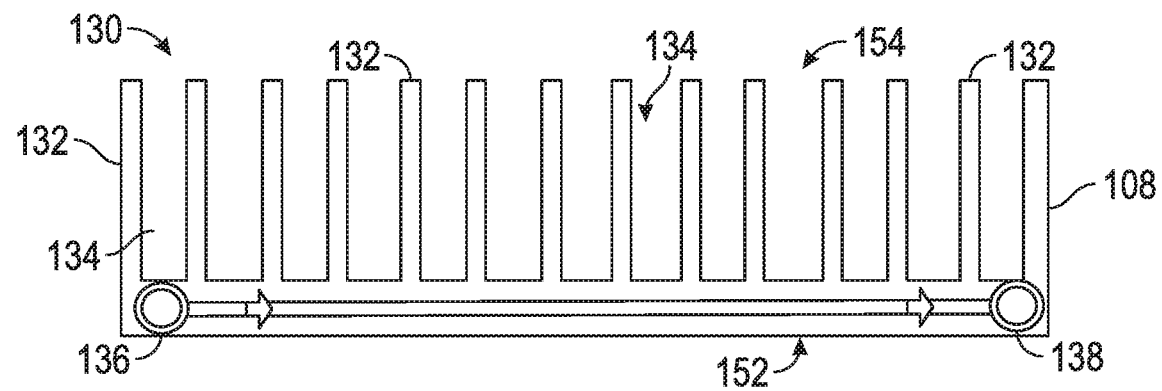
FIG. 6 illustrates planar cross-section view of a hybrid cooling heatsink, according to at least one example of the present disclosure.

FIG. 6 details a hybrid cooling plate of the hybrid cooling system. The hybrid cooling plate 108 can be operable to have both a liquid cooling arrangement 152 and an ambient air cooling arrangement 154. The hybrid cooling plate 108 can thus provide significantly increased thermal cooling capacity to a CPU and/or GPU coupled therewith. The increased thermal cooling capacity can allow the CPU and/or GPU to be operated at higher wattages than normally available in only a liquid or air cooled system.

The hybrid cooling plate 108 can be formed from any material having a high thermal conductivity including, but not limited to, copper, aluminum, and/or alloys of such materials.

The hybrid cooling plate 108 can have an air cooling portion 130 which can include a plurality of fins 132 operable to increase thermal energy transfer to ambient air within the server assembly 100. The plurality of fins 132 can increase the available surface area of the hybrid cooling plate 108, thus increasing the thermal energy transfer. The plurality of fins 132 can be arranged in a predetermined pattern across an entire and/or substantial portion of an upper surface of the hybrid cooling plate 108.

The plurality of fins 132 can extend perpendicularly into an ambient airflow through the server assembly 102. The plurality of fins 132 can be arranged in a predetermined pattern to exposed maximum surface area to an ambient air flow without impeding the airflow. With specific reference to FIG. 6, the plurality of fins 132 form a plurality of channels 134 through with the ambient air can flow. The plurality of channels 134 can be preferably be at least substantially parallel to the direction of the ambient airflow. In at least one instance, the ambient airflow through the server assembly 102 is generated by a plurality of fans 112 causing a pressure differential. While FIG. 6 details a plurality of fins 132 in a substantially linear arrangement, it is within the scope of this disclosure to implement the plurality of fins 132 in any predetermined arrangement operable to maximize surface area for thermal energy transfer for the ambient airflow.

The hybrid cooling plate 108 can also have a liquid cooling portion operable to increase thermal energy transfer from the hybrid cooling plate 108 to a working fluid flowing therethrough. The hybrid cooling plate 108 can have a liquid inlet 136 and a liquid outlet 138 through which the working fluid can pass. The liquid inlet 136 can receive working fluid from the radiator 114 while the liquid outlet have expel working fluid toward the radiator 114 having absorbed thermal energy from the hybrid cooling plate 108. As can be appreciated in FIG. 6, the working fluid can pass laterally across the hybrid cooling plate 108 to maximize thermal energy transfer from the hybrid cooling plate 108 to the working fluid.

Figure 7:
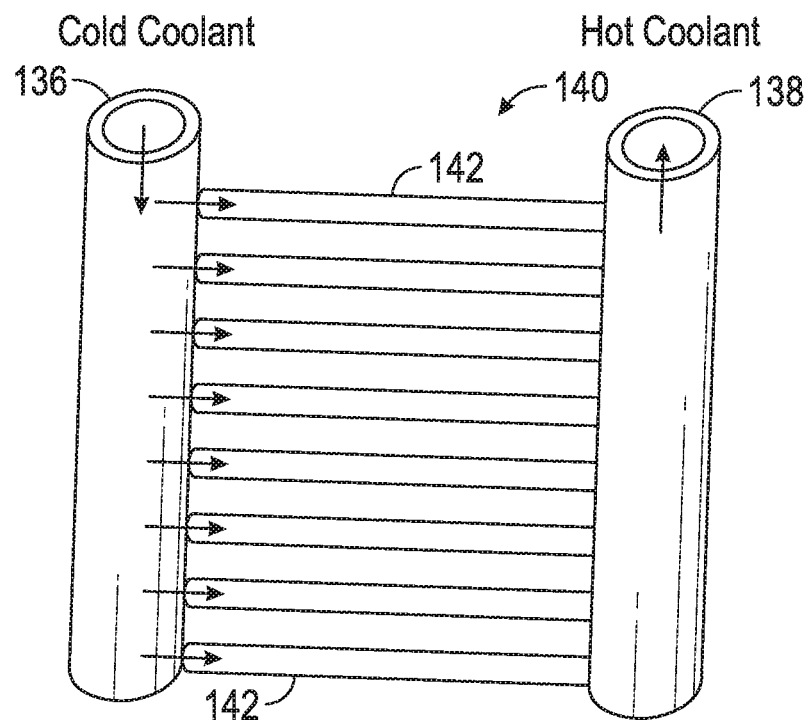
FIG. 7 illustrates an isometric view of a manifold-base cold plate, according to at least one example of the present disclosure.

FIG. 7 details a manifold arrangement of a hybrid cooling plate. The hybrid cooling plate 108 can have a manifold arrangement 140 formed therein. The manifold arrangement 140 can include the liquid inlet 136 and the liquid outlet 138 and a plurality of pipes 142 providing fluidic communication between the liquid inlet 136 and the liquid outlet 138. The liquid inlet 136 can be cooled working fluid from the radiator 114 into the manifold arrangement 140 of the hybrid cooling plate 108. The working fluid can pass through the plurality of pipes 142 toward the liquid outlet 138 while absorbing thermal energy from the hybrid cooling plate 108. The working fluid having the absorbed thermal energy can exit the manifold arrangement 140 through the liquid outlet 138 and return to the radiator 114.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Also, the terms "about", "substantially", and "approximately", as used herein with respect to a stated value or a property, are intend to indicate being within 20% of the stated value or property, unless otherwise specified above. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 8:
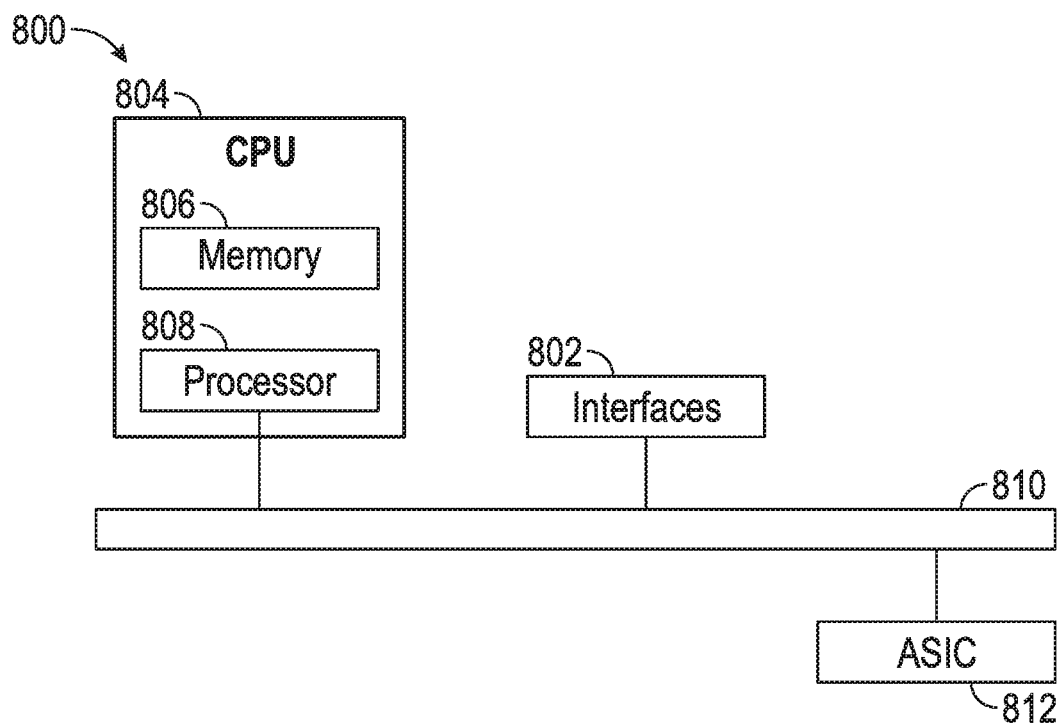
FIG. 8 illustrates an example network device according to at least one example of the present disclosure.
Figure 9:
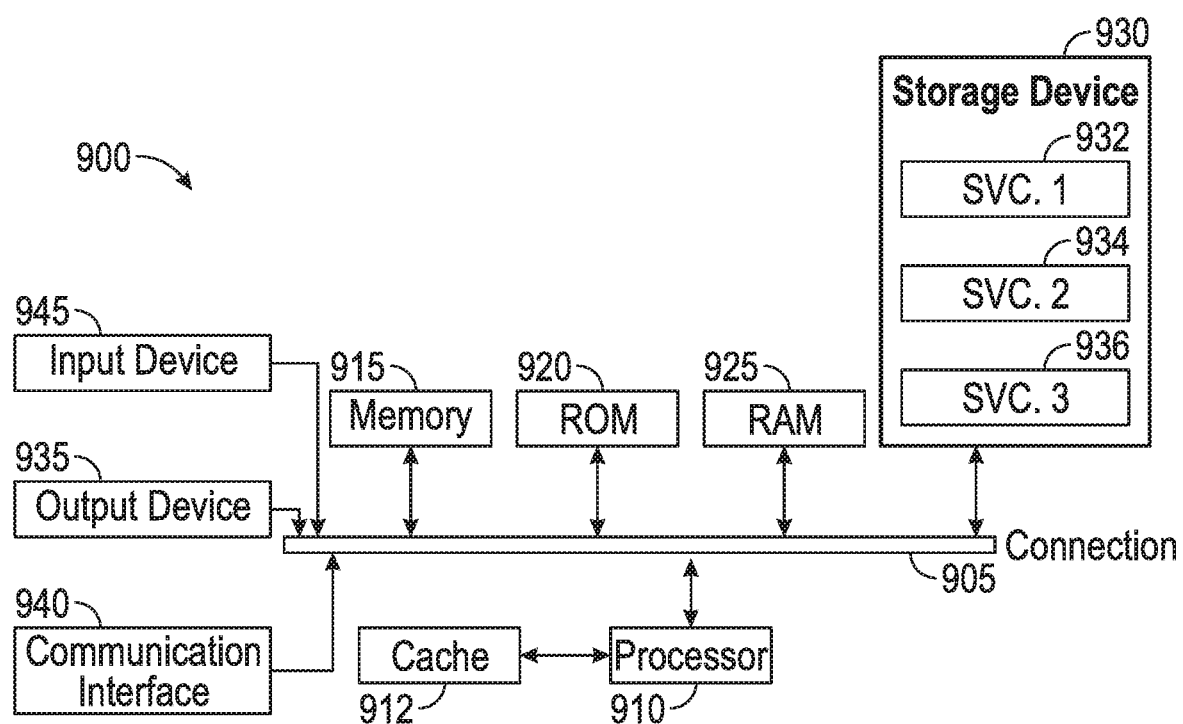
FIG. 9 illustrates an example computing device architecture according to at least one example of the present disclosure.

The disclosure now turns to FIGS. 8 and 9, which illustrate example network devices and computing devices, such as switches, routers, client devices, endpoints, servers, and so forth.

FIG. 8 illustrates an example network device 800 suitable for implementing one or more aspects of the present disclosure. Network device 800 includes a central processing unit (CPU) 804, interfaces 802, and a connection 810 (e.g., a PCI bus). When acting under the control of appropriate software or firmware, the CPU 804 is responsible for executing packet management, error detection, and/or routing functions. The CPU 804 preferably accomplishes all these functions under the control of software including an operating system and any appropriate applications software. CPU 804 may include one or more processors 808, such as a processor from the INTEL X86 family of microprocessors. In some cases, processor 808 can be specially designed hardware for controlling the operations of network device 800. In some cases, a memory 806 (e.g., non-volatile RAM, ROM, etc.) also forms part of CPU 804. However, there are many different ways in which memory could be coupled to the system.

The interfaces 802 are typically provided as modular interface cards (sometimes referred to as "line cards"). Generally, they control the sending and receiving of data packets over the network and sometimes support other peripherals used with the network device 800. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces, WIFI interfaces, 3G/4G/5G cellular interfaces, CAN BUS, LoRA, and the like. Generally, these interfaces may include ports appropriate for communication with the appropriate media. In some cases, they may also include an independent processor and, in some instances, volatile RAM. The independent processors may control such communications intensive tasks as packet switching, media control, signal processing, crypto processing, and management. By providing separate processors for the communications intensive tasks, these interfaces allow the master microprocessor 804 to efficiently perform routing computations, network diagnostics, security functions, etc.

Although the system shown in FIG. 8 is one specific network device according to some examples of the present technologies, it is by no means the only network device architecture on which the present technologies can be implemented. For example, an architecture having a single processor that handles communications as well as routing computations, etc., is often used. Further, other types of interfaces and media could also be used with the network device 800.

Regardless of the network device's configuration, it may employ one or more memories or memory modules (including memory 806) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc. Memory 806 could also hold various software containers and virtualized execution environments and data.

The network device 800 can also include an application-specific integrated circuit (ASIC) 812, which can be configured to perform routing and/or switching operations. The ASIC 812 can communicate with other components in the network device 800 via the connection 810, to exchange data and signals and coordinate various types of operations by the network device 800, such as routing, switching, and/or data storage operations, for example.

FIG. 9 illustrates a computing system architecture 900 wherein the components of the system are in electrical communication with each other using a connection 905, such as a bus. Exemplary system 900 includes a processing unit (CPU or processor) 910 and a system connection 905 that couples various system components including the system memory 915, such as read only memory (ROM) 920 and random access memory (RAM) 925, to the processor 910. The system 900 can include a cache of high-speed memory connected directly with, in close proximity to, or integrated as part of the processor 910. The system 900 can copy data from the memory 915 and/or the storage device 930 to the cache 912 for quick access by the processor 910. In this way, the cache can provide a performance boost that avoids processor 910 delays while waiting for data. These and other modules can control or be configured to control the processor 910 to perform various actions. Other system memory 915 may be available for use as well. The memory 915 can include multiple different types of memory with different performance characteristics. The processor 910 can include any general purpose processor and a hardware or software service, such as service 1 932, service 2 934, and service 3 936 stored in storage device 930, configured to control the processor 910 as well as a special-purpose processor where software instructions are incorporated into the actual processor design. The processor 910 may be a completely self-contained computing system, containing multiple cores or processors, a bus, memory controller, cache, etc. A multi-core processor may be symmetric or asymmetric.

To enable user interaction with the computing device 900, an input device 945 can represent any number of input mechanisms, such as a microphone for speech, a touch-sensitive screen for gesture or graphical input, keyboard, mouse, motion input, speech and so forth. An output device 935 can also be one or more of a number of output mechanisms known to those of skill in the art. In some instances, multimodal systems can enable a user to provide multiple types of input to communicate with the computing device 900. The communications interface 940 can generally govern and manage the user input and system output. There is no restriction on operating on any particular hardware arrangement and therefore the basic features here may easily be substituted for improved hardware or firmware arrangements as they are developed.

Storage device 930 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 925, read only memory (ROM) 920, and hybrids thereof.

The storage device 930 can include services 932, 934, 936 for controlling the processor 910. Other hardware or software modules are contemplated. The storage device 930 can be connected to the system connection 905. In one aspect, a hardware module that performs a particular function can include the software component stored in a computer-readable medium in connection with the necessary hardware components, such as the processor 910, connection 905, output device 935, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments, computer-readable storage devices, media, and memories can include a cable or wireless signal containing a bit stream and the like. However, when mentioned, non-transitory computer-readable storage media expressly exclude media such as energy, carrier signals, electromagnetic waves, and signals per se.

Devices implementing technologies and computing functionality according to these disclosures can comprise hardware, firmware and/or software, and can take any of a variety of form factors. Some examples of such form factors include laptops, smart phones, small form factor personal computers, personal digital assistants, rackmount devices, standalone devices, and so on. Computing functionality can also be embodied in peripherals or add-in cards and circuit boards among different chips or different processes executing in a device, by way of example.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" a set indicates that one member of the set or multiple members of the set satisfy the claim. For example, claim language reciting "at least one of A and B" means A, B, or A and B.

What is claimed is:

1. A hybrid cooling server assembly comprising:
   a printed circuit board (PCB) comprising a processor socket disposed thereon, the processor socket being provided with ambient air from an airflow inlet formed on a surface of the PCB;
   a hybrid cooling plate operably coupled to the processor socket;
   a radiator comprising a working fluid received therein, the working fluid being in fluidic communication with the radiator and the hybrid cooling plate by one or more tubular members; and
   one or more cooling fans proximal to the radiator, wherein the working fluid is operable to receive heat from the hybrid cooling plate and reject heat at the radiator, and wherein the one or more cooling fans are operable to produce an airflow across the hybrid cooling plate thereby enabling the hybrid cooling plate to transfer thermal energy to the airflow.

2. The hybrid cooling server assembly of claim 1, wherein the processor socket is proximal to the airflow inlet formed on the surface of the PCB.

3. The hybrid cooling server assembly of claim 1, further comprising one or more processors configured to dynamically engage airflow cooling via the hybrid cooling plate and the one or more cooling fans, liquid cooling via the hybrid cooling plate and the radiator, or both airflow cooling and liquid cooling.

4. The hybrid cooling server assembly of claim 1, wherein the PCB comprises a plurality of processor sockets disposed thereon, each of the plurality of processor sockets comprising a cooling plate operably coupled therewith.

5. The hybrid cooling server assembly of claim 1, wherein the PCB is a multi-tier PCB comprising a first tier with a first plurality of processor sockets disposed thereon and a second tier comprising a second plurality of processor sockets disposed thereon, the first tier and the second tier vertically arranged.

6. The hybrid cooling server assembly of claim 1, wherein the hybrid cooling plate has a plurality of fins formed on an upper surface operably disposed at least partly within the airflow produced by the one or more cooling fans.

7. The hybrid cooling server assembly of claim 1, wherein the hybrid cooling plate has a manifold therein, the manifold comprising an inlet and an outlet, the inlet directing cold coolant received from the radiator across the hybrid cooling plate and to the outlet back to the radiator.

8. The hybrid cooling server assembly of claim 1, further comprising at least one negative pressure pump, the least one negative pressure pump comprising an inlet pressure and an outlet pressure, the outlet pressure greater than the inlet pressure and the outlet pressure less than atmospheric pressure.

9. The hybrid cooling server assembly of claim 1, further comprising a closed-loop liquid cooling system, the closed-loop liquid cooling system comprising the hybrid cooling plate, the radiator, and the one or more tubular members.

10. A server assembly comprising:
    a housing;
    a printed circuit board (PCB) received within the housing, the PCB comprising a processor socket disposed thereon and an airflow inlet formed on a surface of the PCB, the processor socket being provided with ambient air from an airflow inlet formed on one or more surfaces of the PCB;
    a hybrid cooling plate operably coupled with the processor socket;
    one or more peripheral components communicatively coupled with the PCB;
    a power supply;
    a radiator comprising a working fluid received therein, the working fluid being in fluidic communication with the radiator and the hybrid cooling plate by one or more tubular members;
    one or more cooling fans proximal to the radiator, wherein the working fluid is operable to receive thermal energy from the hybrid cooling plate and reject heat at the radiator; and a plurality of fins formed on a top surface of the hybrid cooling plate, wherein the one or more cooling fans are operable to produce an airflow across the plurality of fins, thereby enabling the hybrid cooling plate to transfer thermal energy to the airflow.

11. The server assembly of claim 10, wherein the processor socket is proximal to the airflow inlet formed on the surface of the PCB.

12. The server assembly of claim 10, wherein the airflow inlet, the processor socket, the radiator, the one or more cooling fans, and an airflow outlet are lineally arranged.

13. The server assembly of claim 10, wherein the PCB has a plurality of processor sockets disposed thereon, each of the plurality of processor sockets comprising a cooling plate operably coupled therewith.

14. The server assembly of claim 10, wherein the PCB is a multi-tier PCB comprising a first tier with a first plurality of processor sockets disposed thereon and a second tier comprising a second plurality of processor sockets disposed thereon, the first tier and the second tier vertically arranged.

15. The server assembly of claim 10, wherein the plurality of fins are operably disposed at least partially within the airflow produced by the one or more cooling fans.

16. The server assembly of claim 10, wherein the hybrid cooling plate has a manifold therein, the manifold comprising an inlet and an outlet, the inlet directing cold coolant from received from the radiator across the hybrid cooling plate and to the outlet back to the radiator.

17. The server assembly of claim 10, further comprising at least one negative pressure pump, the least one negative pressure pump comprising an inlet pressure and an outlet pressure, the outlet pressure greater than the inlet pressure and the outlet pressure less than atmospheric pressure.

18. The server assembly of claim 10, further comprising:
one or more hard disk drives arranged adjacent to the radiator.

19. The server assembly of claim 10, further comprising a closed-loop liquid cooling system, the closed-loop liquid cooling system comprising the hybrid cooling plate, the radiator, and the one or more tubular members.

20. The server assembly of claim 10, further comprising one or more processors configured to dynamically engage airflow cooling via the hybrid cooling plate and the one or more cooling fans, liquid cooling via the hybrid cooling plate and the radiator, or both airflow cooling and liquid cooling.

* * * * *